(12) United States Patent　　(10) Patent No.: US 8,378,210 B2
Taguchi　　(45) Date of Patent: Feb. 19, 2013

(54) WATERPROOF CASE FOR ELECTRONIC DEVICE

(75) Inventor: Maki Taguchi, Kanagawa (JP)

(73) Assignee: Sony Corporation (JP)

( * ) Notice: Subject to any disclaimer, the term of this patent is extended or adjusted under 35 U.S.C. 154(b) by 239 days.

(21) Appl. No.: 12/928,839

(22) Filed: Dec. 21, 2010

(65) Prior Publication Data

US 2011/0155410 A1　　Jun. 30, 2011

(30) Foreign Application Priority Data

Dec. 29, 2009　(JP) ................................ P2009-299186

(51) Int. Cl.
*H05K 5/00*　　(2006.01)
*G03B 17/08*　　(2006.01)
*G03B 17/56*　　(2006.01)

(52) U.S. Cl. ............ 174/50; 174/520; 396/419; 396/25; 396/27; 206/316.2

(58) Field of Classification Search ............... 174/50, 174/50.5, 17 R, 520, 559, 564; 396/419, 396/25, 27, 29, 28; 206/316.2, 316.1, 701, 206/722, 320, 576
See application file for complete search history.

(56) References Cited

U.S. PATENT DOCUMENTS

| | | | |
|---|---|---|---|
| 5,946,501 A * | 8/1999 | Hayakawa | 396/25 |
| 7,082,264 B2 * | 7/2006 | Watanabe et al. | 396/28 |
| 7,352,961 B2 * | 4/2008 | Watanabe et al. | 396/27 |
| 7,789,228 B2 | 9/2010 | Zenzai | |
| 7,801,425 B2 * | 9/2010 | Fantone et al. | 396/27 |
| 8,265,469 B2 * | 9/2012 | Lai | 396/25 |

FOREIGN PATENT DOCUMENTS

JP　2009-037136 A　2/2009

\* cited by examiner

*Primary Examiner* — Angel R Estrada
(74) *Attorney, Agent, or Firm* — Lerner, David, Littenberg, Krumholz & Mentlik, LLP

(57) ABSTRACT

A waterproof case for an electronic device includes a case portion configured to house an electronic device including a touch panel display, and an operation mechanism provided to the case portion and configured to operate the touch panel display of the electronic device, which is housed in the case portion, from an outside of the case portion. In the waterproof case, the operation mechanism includes a push button, a return spring configured to energize the push button toward the outside of the case portion, a moving lever configured to move in a pressing direction when the push button is pressed toward an inside of the case portion, and an operation lever configured to rotate in a direction approximately orthogonal to the pressing direction so as to bring a contact portion into contact with a predetermined region of the touch panel display when being pressed by the moving lever.

3 Claims, 9 Drawing Sheets

WATERPROOF CASE FOR ELECTRONIC DEVICE

CROSS-REFERENCE TO RELATED APPLICATION

The present application claims priority from Japanese Patent Application No. JP 2009-299186 filed in the Japanese Patent Office on Dec. 29, 2009, the entire content of which is incorporated herein by reference.

BACKGROUND OF THE INVENTION

1. Field of the Invention

The present invention relates to a waterproof case for an electronic device which is favorable for an electronic device such as a digital still camera.

2. Description of the Related Art

A waterproof case for an electronic device is provided with a plurality of operating members for operating an operation switch of an electronic device which is housed in the waterproof case. Such operating members include a push button which is provided on an outer surface of the waterproof case and a contact portion which is provided on an inner surface of the waterproof case and is configured to press the operation switch of the electronic device in response to a pressing operation of the push button. The electronic device housed in the waterproof case for an electronic device is operated by operating each of the operating members.

Some digital still cameras include a touch panel display obtained by applying a sheet-like transparent touch panel to a display surface of a display panel for image and video image display of the digital still cameras. The digital still camera is tend to be configured such that a function of operation switches is provided to a touch panel display so as to decrease the number of operation switches provided on a casing thereof. Accordingly, the digital still camera has a compact casing and the size of the display surface of the touch panel display is secured.

In a case where a digital still camera including such touch panel display is housed in a related art waterproof case for an electronic device described above, an operating portion including a plurality of push buttons, a boss portion for supporting the operating portion, and the contact portion of a related art operating member are aligned in a pressing direction and these portions are positioned in a profile of the touch panel display. Accordingly, in the related art waterproof case for an electronic device, it is difficult to visually recognize display contents and icons which are displayed on the touch panel display, and even when the size of the display surface of the touch panel display is increased, it is still difficult to visually recognize display contents.

Therefore, Japanese Unexamined Patent Application Publication No. 2009-37136 (US 2009-032420A1) discloses a waterproof case for an electronic device in which an operating portion including a push button and a boss portion for supporting the operating portion are positioned outside a profile of a touch panel display and a contact portion which is made of transparent resin is formed to be positioned inside the profile via an elastic arm.

However, in the waterproof case for an electronic device of Japanese Unexamined Patent Application Publication No. 2009-37136 (US2009-032420A1), since a pressing direction of the push button and a direction in which the contact portion presses the touch panel display are same as each other, it is necessary to dispose the push button and the boss portion on a visual-recognition surface which faces the touch panel display of a case portion. Further, in the waterproof case for an electronic device of Japanese Unexamined Patent Application Publication No. 2009-37136 (US 2009-032420A1), the push button and the boss portion largely protrude from the visual-recognition surface so as to secure a stroke of a return spring which is configured to return the push button to the outside under pressure, limiting a design of the case.

SUMMARY OF THE INVENTION

It is desirable to provide a waterproof case for an electronic device that secures operability and visibility of a touch panel display and has an advantage for realizing improvement of design flexibility.

A waterproof case for en electronic device according to an embodiment of the present invention includes a case portion configured to house an electronic device that includes a touch panel display, and an operation mechanism that is provided to the case portion and is configured to operate the touch panel display of the electronic device, which is housed in the case portion, from an outside of the case portion. The operation mechanism includes a push button, a return spring configured to energize the push button toward the outside of the case portion, a moving lever configured to move in a pressing direction when the push button is pressed toward an inside of the case portion, and an operation lever configured to rotate in a direction approximately orthogonal to the pressing direction so as to bring a contact portion into contact with a predetermined region of the touch panel display when being pressed by the moving lever.

According to the embodiment of the present invention, when the push button is pressed toward the inside of the case portion, then the moving lever is moved to the pressing direction and the operation lever is pressed by the moving lever, the operation lever rotates about the rotating shaft in conjunction with the moving lever in a direction approximately orthogonal to the pressing direction, and the contact portion can be brought into contact with the predetermined region of the touch panel display housed in the housing portion of the waterproof case. Thus, the operation mechanism can be disposed on a surface which is orthogonal to the touch panel display and is at the outside of a profile of the touch panel display. Accordingly, operability and visibility of the touch panel display can be secured and the design flexibility can be improved.

DESCRIPTION OF THE PREFERRED EMBODIMENTS

A waterproof case for an electronic device (referred to below as a waterproof case) to which an embodiment of the present invention is applied is described in detail below with reference to the accompanying drawings. An embodiment in which an electronic device housed in a waterproof case is a digital still camera is described. The description is offered as the following order.

1. Configuration of External Appearance of Digital Still Camera
2. Configuration of Waterproof Case
3. Configuration of Operation Mechanism
4. Operation of Operation Mechanism
5. Operational Effect of Waterproof Case
6. Modification of Waterproof Case <1. Digital Still Camera>

Figure 1:
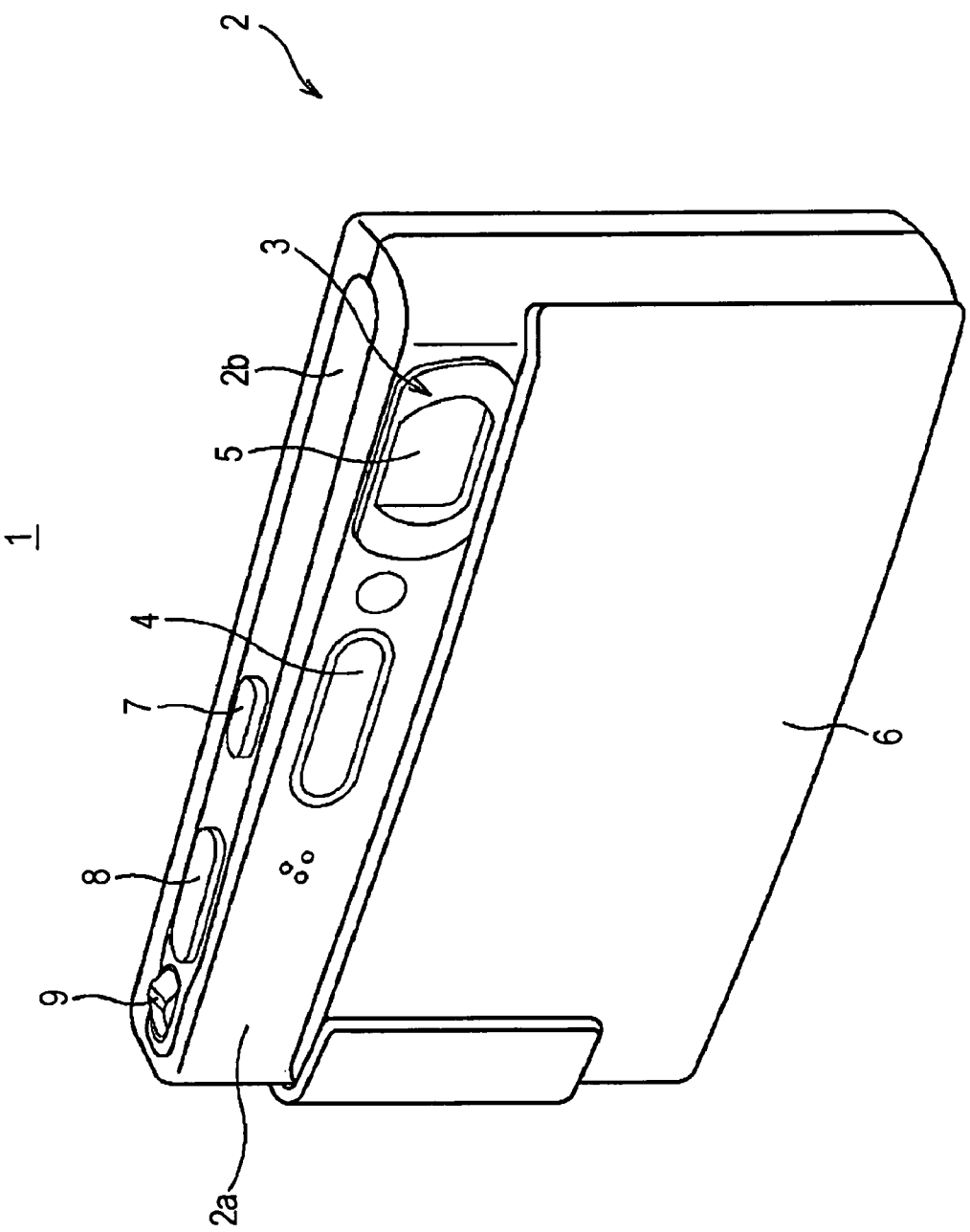
FIG. 1 is a front perspective view of a digital still camera.
Figure 2:
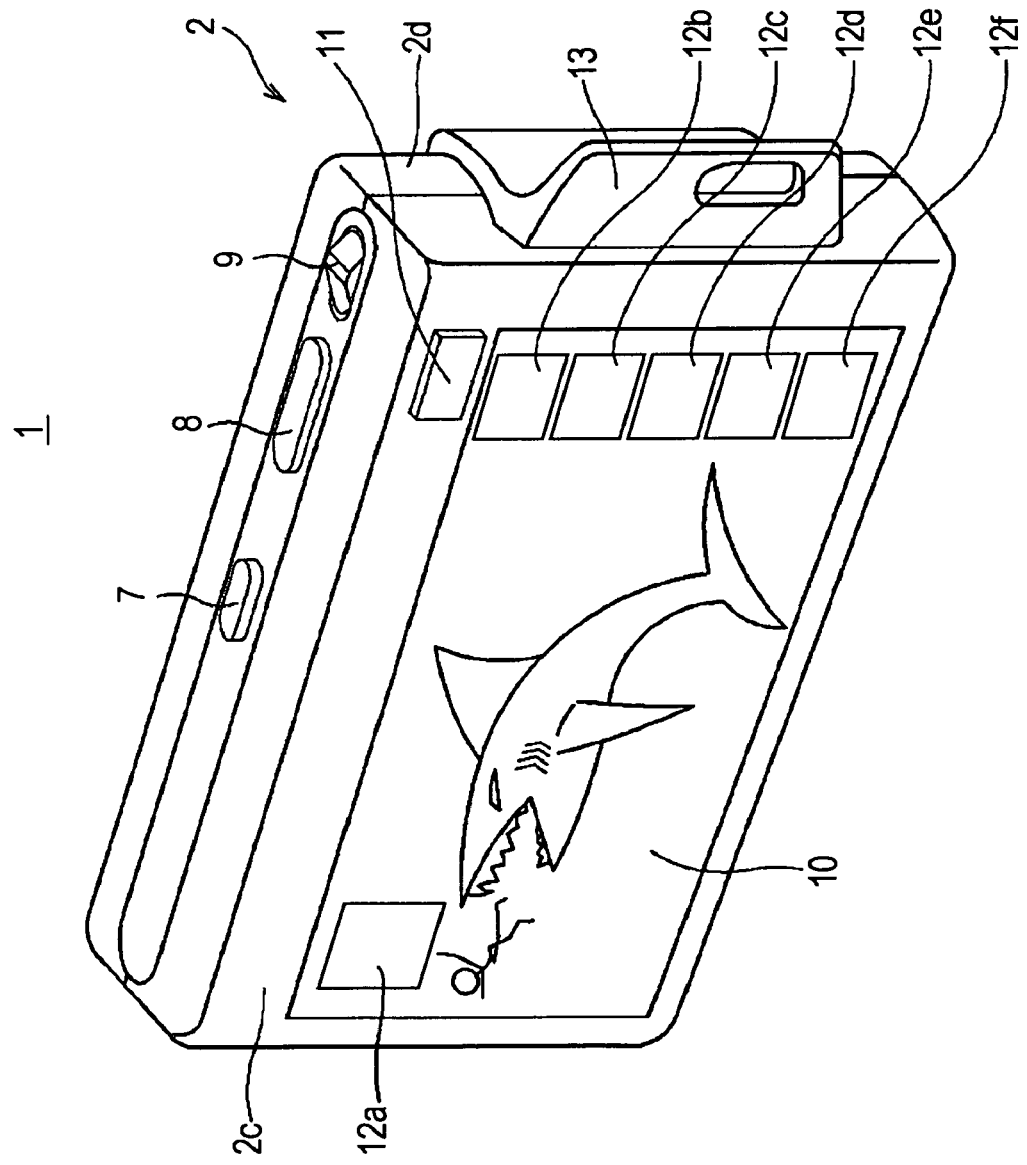
FIG. 2 is a back perspective view of the digital still camera.

A digital still camera 1 to be housed in a waterproof case 20 to which an embodiment of the present invention is applied includes a camera body 2 constituting an external package, as shown in FIGS. 1 and 2.

On an upper portion of a front surface portion 2a of the camera body 2, a lens mechanism 3, a flash mechanism 4 which is laterally provided in a vicinal position to the lens mechanism 3, and an imaging device (not shown) which forms a video signal of a photographing object based on light incident from a photographing lens 5 of the lens mechanism 3. Further, at a lower portion of the front surface portion 2a of the camera body 2, a lens cover 6 which opens and closes the photographing lens 5.

The imaging device of the digital still camera 1 is housed inside the camera body 2, though it is not shown. The imaging device is a charge coupled device (CCD) imaging sensor or a complementary metal-oxide semiconductor (CMOS) imaging sensor, for example, and is disposed at the backward on an optical axis of the lens mechanism 3.

The lens cover 6 is supported in a manner to be able to slide in upper and lower directions with respect to the camera body 2, and opens and closes the photographing lens 5 and the flash mechanism 4 which are disposed on the upper portion of the front surface portion 2a of the camera body 2. When the lens cover 6 is slid to the lower direction so as to be positioned at a lens opening position, the photographing lens 5 and a light-emitting portion of the flash mechanism 4 are both opened, enabling a photographing operation. On the other hand, when the lens cover 6 is slid to the upper direction to be positioned at a lens closing position, the photographing lens 5 and the light-emitting portion are both closed, disabling the photographing operation.

On an upper surface portion 2b of the camera body 2, a power button 7 for turning a power source on or off, a photographing button 8 for performing imaging, and a zoom lever 9 for performing a zooming operation to a wide angle side or a telephoto side.

On a back surface portion 2c of the camera body 2, a touch panel display 10 and a reproduction button 11 are provided. The touch panel display 10 displays an image and a video image imaged by the imaging device, and an image and a video image which have already been stored in a memory of the digital still camera 1. The reproduction button 11 is provided above the touch panel display 10 and is used for reproducing and displaying these images and video images on the touch panel display 10.

The touch panel display 10 is formed to largely occupy the back surface of the camera body 2. In the touch panel display 10, when pressure is placed on a sheet-like transparent touch panel which is bonded to a display surface of a liquid-crystal display or an organic EL display, for example, various types of operations and settings, which are related to photographing and reproduction, of the digital still camera 1 are performed.

When the digital still camera 1 is set in a special mode that the digital still camera 1 is housed in the waterproof case 20 and is used in underwater imaging, for example, icons 12 used for operating the digital still camera 1 in this mode are displayed on the touch panel display 10. For example, a first icon 12a is displayed on an upper left side, in a back view, of the touch panel display 10. Further, second to sixth icons 12b, 12c, 12d, 12e, and 12f are displayed on a right side, in the back view, of the touch panel display 10 in a manner that the icons 12b to 12f are vertically aligned with intervals interposed therebetween.

The first icon 12a is a reproduction button icon which corresponds to the reproduction button 11 of the camera 1, for example. The second to sixth icons 12b to 12f are icons for performing other operations and settings of the digital still camera 1. For example, the second to sixth icons 12b to 12f are a photographing mode setting icon for setting moving image photographing or still image photographing, a flash mode setting icon for setting an operation mode of the flash mechanism 4, a macro mode setting icon for setting macro photographing or normal photographing, and the like.

Here, the operation icons 12 displayed on the touch panel display 10 are not limited to the above mentioned icons, but the operation icons 12 may be icons for performing other operations or settings of the digital still camera 1.

Further, on a right side portion 2d of the camera body 2, a clamp 13 for attaching a strap or the like is provided.

<2. Waterproof Case>

Figure 3:
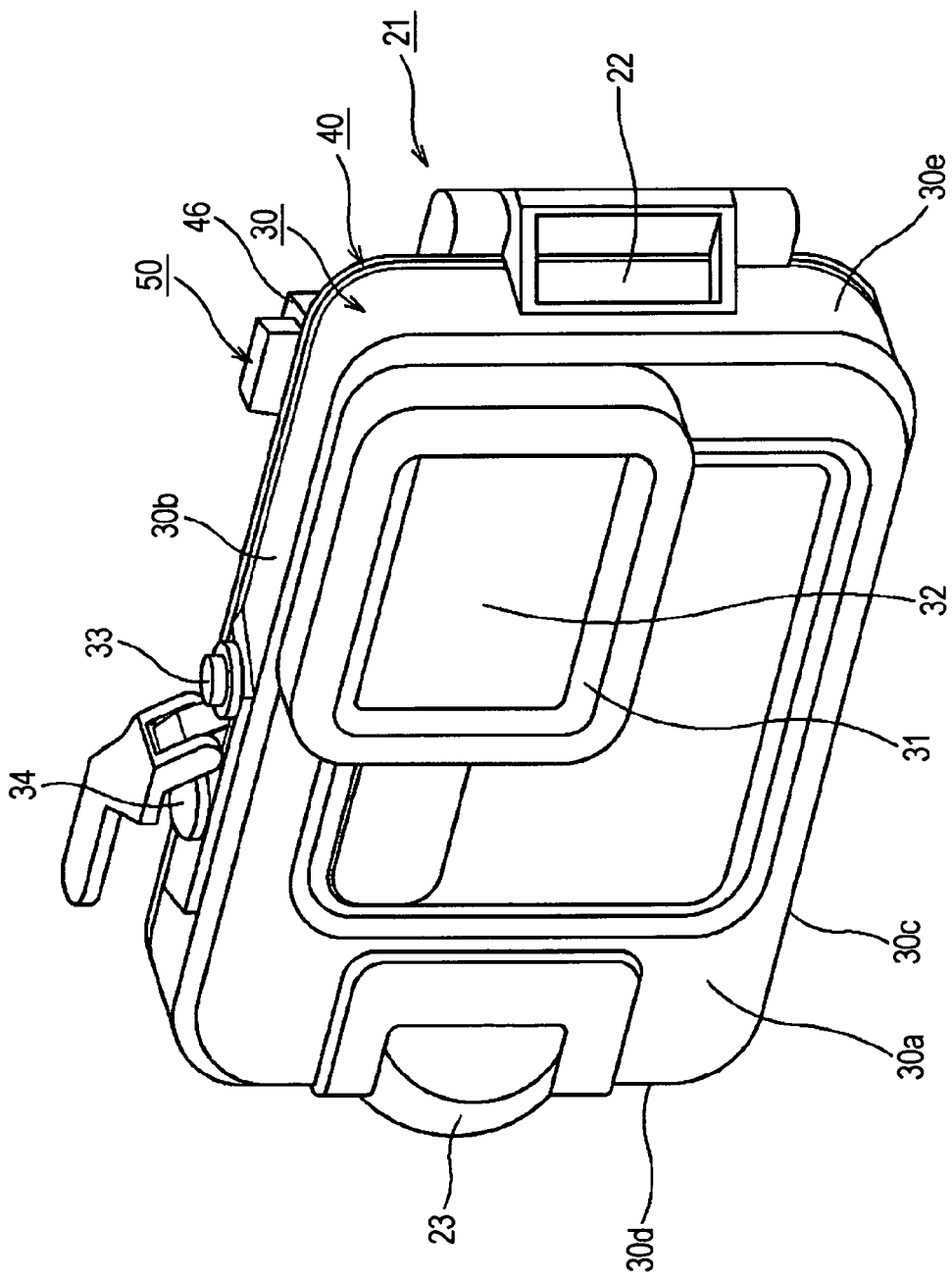
FIG. 3 is a front perspective view of a waterproof case to which an embodiment of the present invention is applied.
Figure 4:
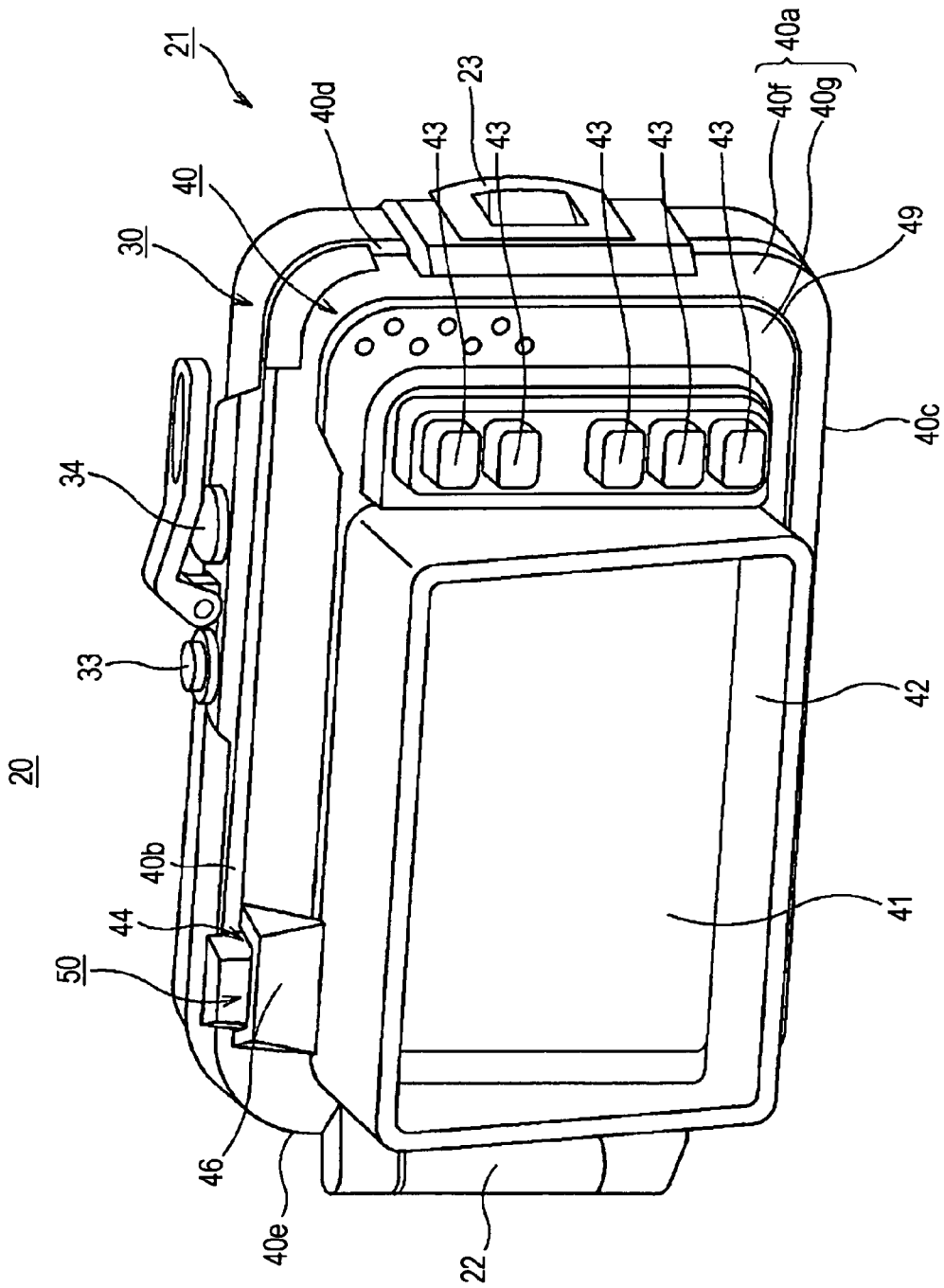
FIG. 4 is a back perspective view of the waterproof case to which the embodiment of the present invention is applied.
Figure 5:
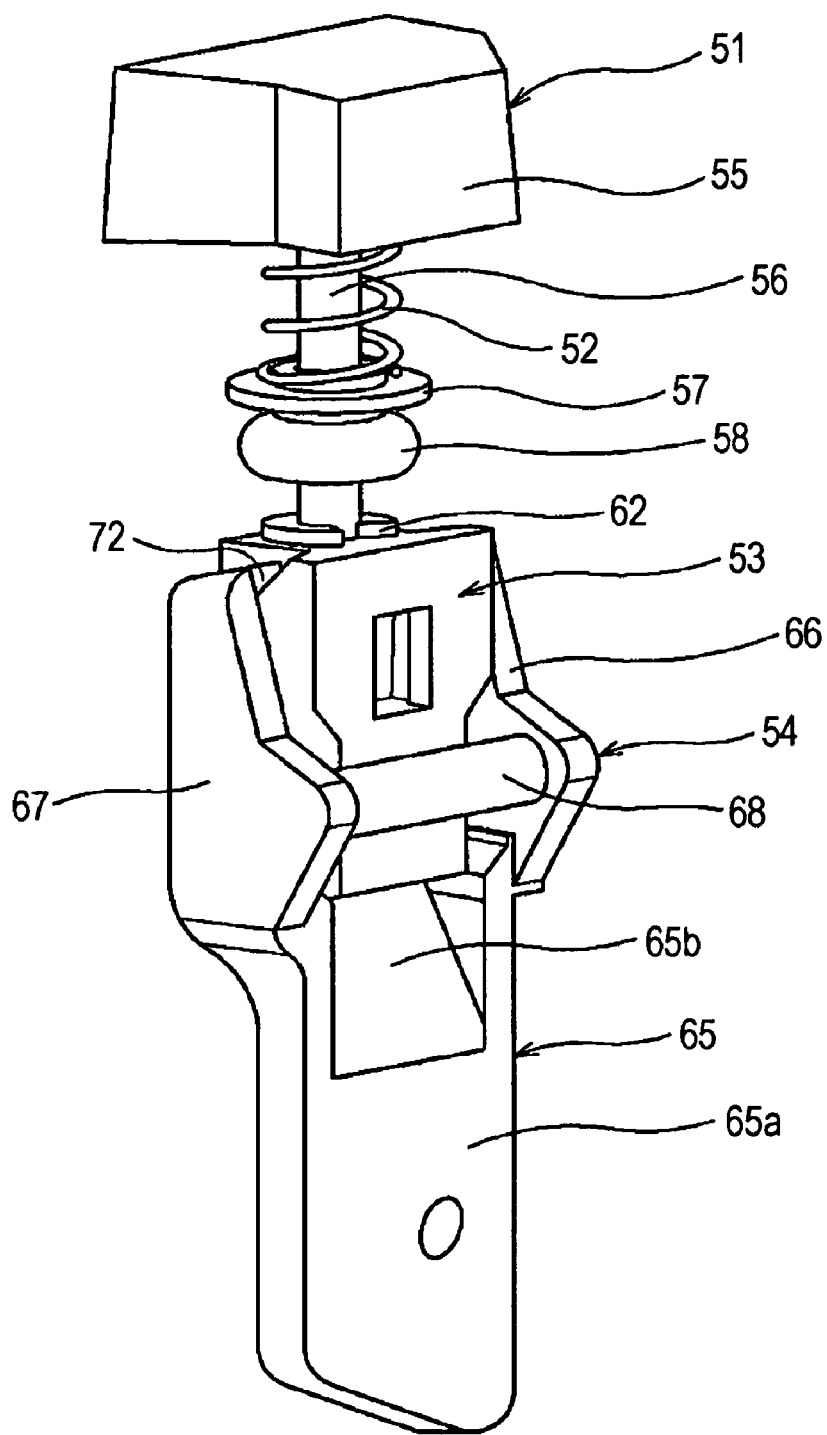
FIG. 5 is a perspective view of an operation mechanism.
Figure 6:
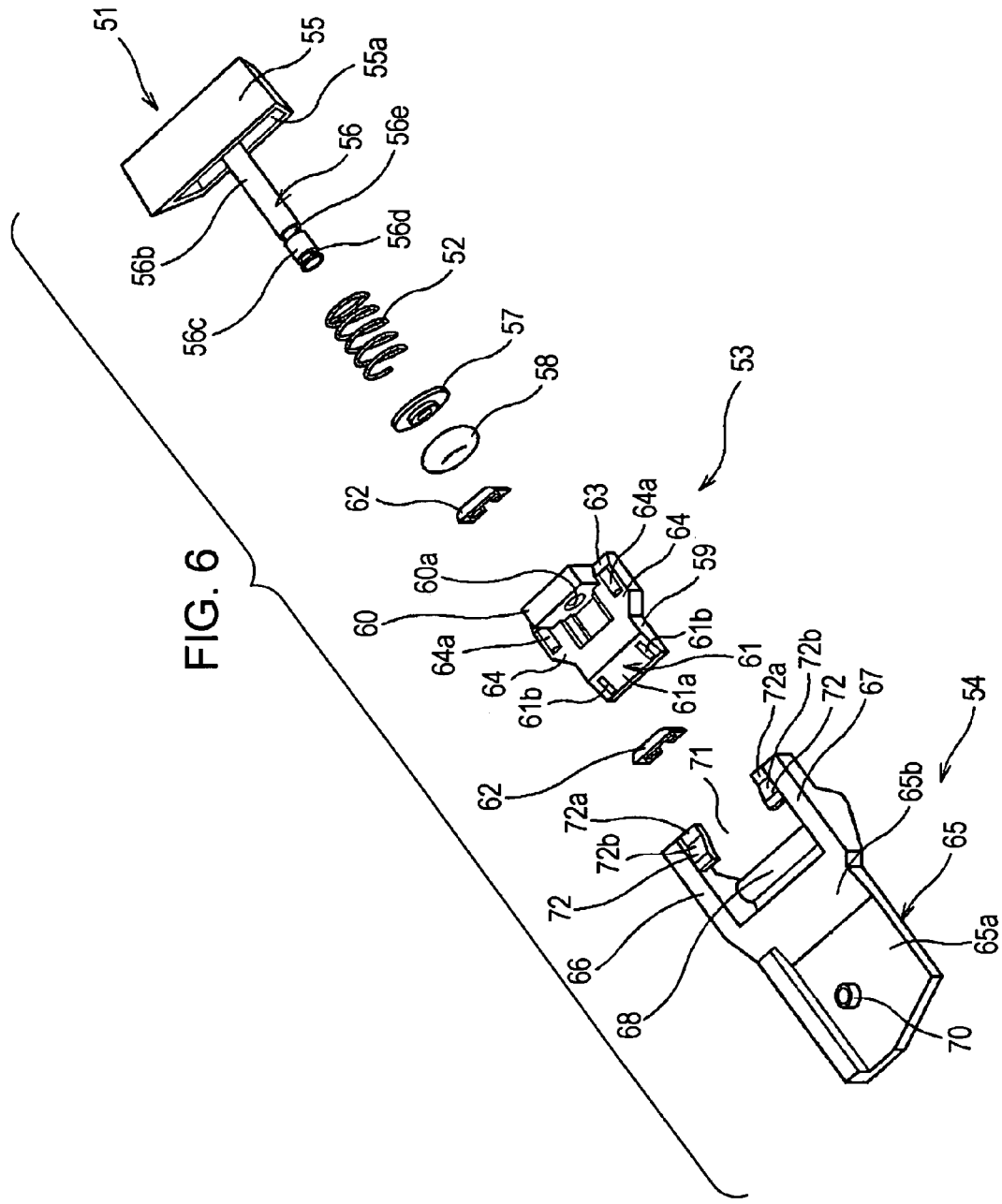
FIG. 6 is an exploded perspective view of the operation mechanism.
Figure 7:
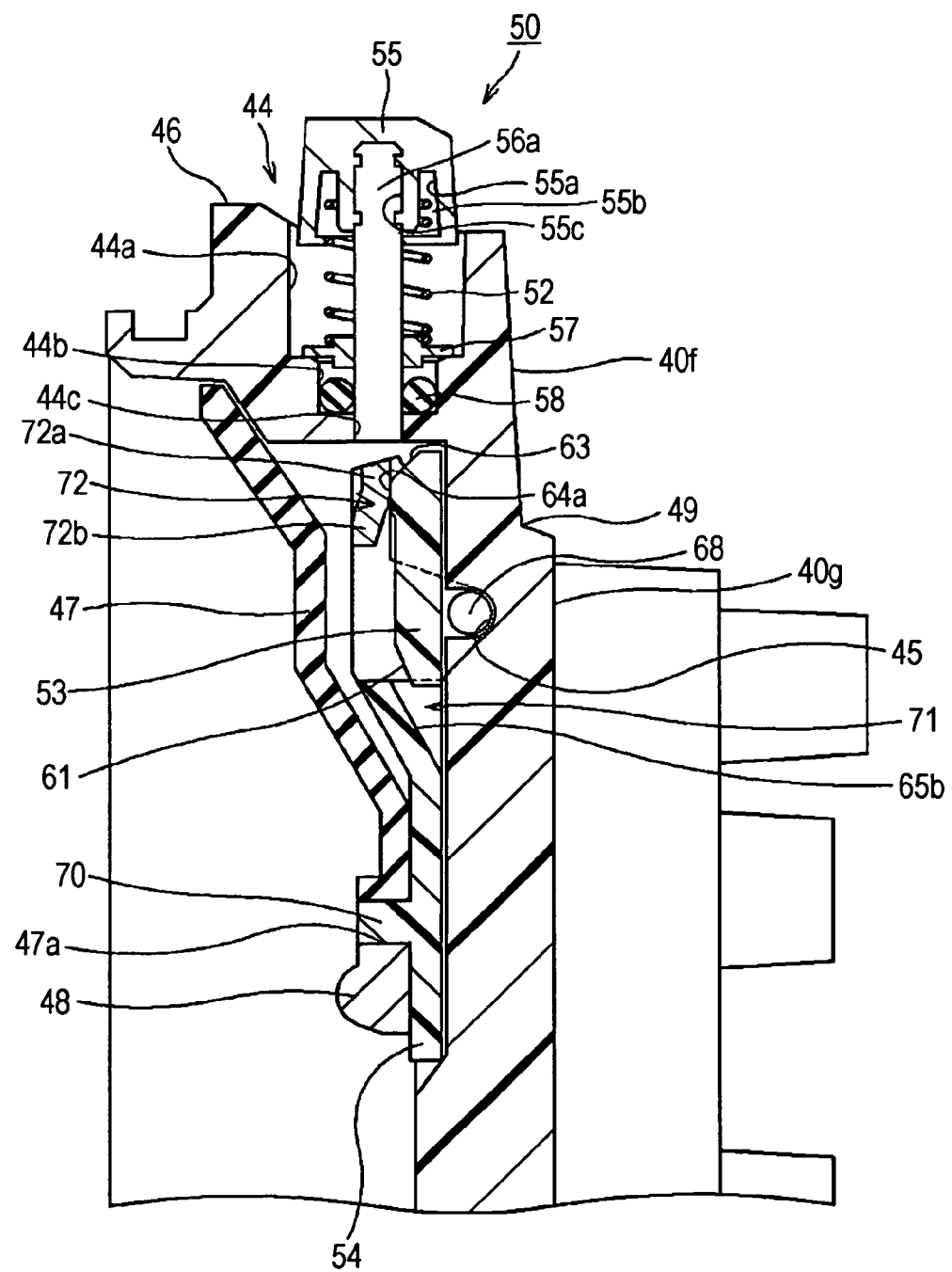
FIG. 7 is a longitudinal sectional view showing a state of the operation mechanism before rotation.

The waterproof case 20 includes a case portion 21 and an operation mechanism 50 as shown in FIGS. 3 and 4. The case portion 21 detachably houses the digital still camera 1. The operation mechanism 50 operates the touch panel display 10 of the digital still camera 1, which is housed inside the case portion 21, from the outside of the case portion 21.

The case portion 21 includes a front case 30 and a rear case 40 which are rotatably joined with a hinge 22, and a buckle 23 which is a fastening mechanism of the front case 30 and the rear case 40. The front case 30 and the rear case 40 are respectively formed to have closed-end box shapes respectively including housing recessed portions therein. The front case 30 and the rear case 40 are overlapped with each other in a manner that their housing recessed portions are opposed to each other. Accordingly, the case portion 21 is provided with a housing portion in which the digital still camera 1 can be housed.

The front case 30 and the rear case 40 are made of polycarbonate (PC), for example. However, the material of the front case 30 and the rear case 40 is not limited polycarbonate. The front case 30 and the rear case 40 may be made of other synthetic resin or metal such as aluminum alloy. Alternatively, the material may be transparent PC or the like so as to make the inner configuration visible, or other synthetic resin which is transparent, translucent, or opaque.

The front case 30 is formed to have the closed-end box shape including a front housing recessed portion which constitutes the housing portion in which the digital still camera 1 is housed. Specifically, the front case 30 includes a front surface portion 30a having an approximately quadrangular shape, an upper surface portion 30b and a lower surface portion 30c which are respectively continued above and below the front surface portion 30a, and a left side surface portion 30d and a right side surface portion 30e which are respectively continued left and right of the front surface portion 30a, as shown in FIG. 3.

On the front surface portion 30a of the front case 30, a lens window 31 having an approximately quadrangular shape is provided. The lens window 31 is disposed such that when the digital still camera 1 is housed in the front housing recessed portion of the waterproof case 20, the lens window 31 faces the photographing lens 5 of the lens mechanism 3 of the digital still camera 1 which is housed. Further, a glass plate 32 is attached to the lens window 31 so as to naturally input outside light into the lens mechanism 3.

On the upper surface portion 30b of the front case 30, a power button 33, a photographing button 34, and the operation mechanism 50 of the case are provided. The power button 33 and the photographing button 34 of the case are disposed at positions respectively corresponding to the power button 7 and the photographing button 8 of the digital still camera 1 which is housed in the front housing recessed portion of the waterproof case 20. Accordingly, when the power button 33 of the case is pressed, the power button 7 of the camera is pressed. In addition, when the photographing button 34 of the case is pressed, the photographing button 8 of the camera is pressed. The operation mechanism 50 will be described later.

The rear case 40 is formed to have the close-end box shape including a rear housing recessed portion which constitutes the housing portion in which the digital still camera 1 is to be housed. Specifically, the rear case 40 includes a rear surface portion 40a having an approximately quadrangular shape, an upper surface portion 40b and a lower surface portion 40c which are respectively continued above and below the rear surface portion 40a, and a left side surface portion 40d and a right side surface portion 40e which are respectively continued left and right the rear surface portion 40a, as shown in FIG. 4. When the rear housing recessed portion of the rear case 40 is overlapped with the front housing portion of the front case 30 to be opposed to each other, the rear surface portion 40a faces the front surface portion 30a of the front case 30, the upper surface portion 40b and the lower surface portion 40c respectively face the upper surface portion 30b and the lower surface portion 30c, and the left side surface portion 40d and the right side surface portion 40e respectively face the left side surface portion 30d and the right side surface portion 30e.

Further, the rear surface portion 40a of the rear case 40 is composed of a first rear surface portion 40f and a second rear surface portion 40g which is provided at an approximate center of the first rear surface portion 40f via a level difference 49 to protrude outward. On the second rear surface portion 40g of the rear case 40, a visual-recognition window 41 and a case hood 42 are provided. The visual-recognition window 41 is used to visually recognize the touch panel display 10 of the digital still camera 1 which is housed in the housing portion of the waterproof case 20. The case hood 42 is provided on an outer surface to surround the visual-recognition window 41.

The visual-recognition window 41 is disposed such that when the digital still camera 1 is housed in the housing portion of the waterproof case 20, the visual-recognition window 41 faces the touch panel display 10. The visual-recognition window 41 enables visual recognition of the touch panel display 10 of the digital still camera 1 from the outside even when the digital still camera 1 is housed in the housing portion of the waterproof case 20.

The case hood 42 is provided over the whole circumference of the visual-recognition window 41 to surround the visual-recognition window 41, on a main surface of the second rear surface portion 40g. The case hood 42 protrudes toward an outside which is an opposite side to which the rear housing recessed portion is provided. Accordingly, the case hood 42 prevents light from entering the digital still camera 1 from the rear surface side and the touch panel display 10 of the digital still camera 1 from being illuminated with the light.

Further, at a lateral side of the case hood 42 on the second rear surface portion 40g of the rear case 40, an operation button group which includes a plurality of operation buttons 43 of the waterproof case 20 side is provided. The operation buttons 43 are used to operate the operation icons 12, which are displayed on the touch panel display 10 of the digital still camera 1 housed in the housing portion of the waterproof case 20, from the outside of the digital still camera 1. The operation buttons 43 respectively correspond to the operation icons 12 displayed on the touch panel display 10 of the digital still camera 1 which is housed in the housing portion of the waterproof case 20, and are disposed to respectively overlap with display positions of the operation icons 12. The operation buttons 43 have the similar configuration to the operation mechanism of Japanese Unexamined Patent Application Publication No. 2009-37136 (US 2009-032420A1), an operating portion including a push button and a boss portion for supporting the operating portion are disposed outside a profile of the touch panel display, and a contact portion is disposed inside the profile via an elastic arm. Detailed description of each of the operation buttons 43 is omitted.

On an inner surface of the second rear surface portion 40g of the rear case 40, a buffering member 47 is provided to surround the visual-recognition window 41. The buffering member 47 serves as a cushion of the digital still camera 1 which is housed. The buffering member 47 is made of an elastic material such as rubber. The buffering member 47 includes a contact portion 48 which is formed to contact with the first icon 12a, which is displayed on the touch panel display 10 housed in the housing portion of the waterproof case 20, when an operation lever 54 is rotated about a rotating shaft 68. The contact portion 48 is formed in a convex shape, and is disposed at a position which overlaps with the display position of the first icon 12a displayed on the touch panel display 10 of the digital still camera 1 which is housed in the housing portion of the waterproof case 20.

Further, on the upper surface portion 40b of the rear case 40, the operation mechanism 50 is provided. The operation mechanism 50 abuts onto the first icon 12a, which is displayed on the touch panel display 10 of the digital still camera 1 housed in the housing portion of the waterproof case 20, so as to allow the digital still camera 1 to perform a reproduction operation, from the outside.

<3. Operation Mechanism>

The operation mechanism 50 of the waterproof case 20 includes a push button 51, a return spring 52 energizing the push button 51 toward the outside of the case portion 21, a moving lever 53 which moves to a pressing direction when the push button 51 is pressed toward the inside of the case portion 21, and an operation lever 54 which rotates to a direction approximately orthogonal to the pressing direction when pressed by the moving lever 53, as shown in FIGS. 5 to 10. The operation mechanism 50 having such configuration is provided in an attachment hole 44 which is formed in the boss portion 46 provided on the upper surface portion 40b of the rear case 40. The attachment hole 44 includes a first housing hole 44a which houses the push button 51 and the return spring 52, a second housing hole 44b which is formed at a bottom surface of the first housing hole 44a and houses a seal member 58, which will be described later, and an insertion hole 44c which passes through the first housing hole 44a, the second housing hole 44b, and the inside of the case portion 21.

The push button 51 includes a head portion 55, and a shaft portion 56 which is integrally formed with the head portion 55 and protrudes to the inside of the case portion 21 from the insertion hole 44c of the attachment hole 44.

The head portion 55 is formed to have a box shape having a quadrangular bottom surface, for example, and includes a recessed portion 55a at a lower surface to which the shaft portion 56 is integrated. At an approximate center of the bottom surface of the recessed portion 55a, a connecting portion 55b at which the shaft portion 56 is connected is provided. The connecting portion 55b is formed to protrude toward the shaft portion 56 and have a cylindrical shape. On a top surface of the connecting portion 55b, a connecting hole 55c is formed. The shaft portion 56 is press-inserted in the connecting hole 55c so as to be integrated with the head portion 55.

The shaft portion 56 integrated with the head portion 55 is formed in an order of a base end portion 56a, an intermediate portion 56b, and a front end portion 56c that respectively have predetermined lengths in a shaft direction. The base end portion 56a of the shaft portion 56 is press-inserted into the connecting hole 55c of the head portion 55 to be integrated with the head portion 55. On a circumference of the intermediate portion 56b of the shaft portion 56, the return spring 52 is disposed. The return spring 52 is a coil spring that has an inner diameter which is larger than the connecting portion 55b of the head portion 55 and has an outer diameter which is smaller than an inner diameter of the recessed portion 55a of the head portion 55, for example. The coil spring is housed in the inside of the recessed portion 55a of the head portion 55 at one end thereof so as to abut on the bottom surface of the recessed portion 55a.

Further, on a circumference of the intermediate portion 56b of the shaft portion 56, a spring support washer 57 is disposed in a manner to sandwich the return spring 52 together with the head portion 55. The spring support washer 57 is formed in a ring fashion to have an inner diameter which is slightly larger than an outer diameter of the shaft portion 56 and have an outer diameter which is larger than the return spring 52 and the second housing hole 44b and is smaller than the first housing hole 44a. The spring support washer 57 is attached to engage with the second housing hole 44b which is formed on the bottom surface of the first housing hole 44a, and supports the other end of the return spring 52. Accordingly, the return spring 52 of which the other end is supported by such the spring support washer 57 constantly energizes the push button 51 toward the outside of the case portion 21.

Further, on the circumference of the intermediate portion 56b of the shaft portion 56, the seal member 58 is disposed to be closer to the front end portion 56c than the spring support washer 57. The seal member 58 is an O ring, for example, and is fitted to the second housing hole 44b so as to liquid-tightly seal the circumference of the shaft portion 56.

Further, to the front end portion 56c of the shaft portion 56, the moving lever 53 is attached. The moving lever 53 is made of polyoxymethylene (POM) or the like, for example. Alternatively, the moving lever 53 may be made of other synthetic resin. The moving lever 53 includes a moving lever body portion 59 and a shaft portion attachment portion 60. The shaft portion attachment portion 60 is provided to a base end, which corresponds to a base end portion 56a side of the shaft portion 56, of the moving lever body portion 59, and the shaft portion 56 is attached to the shaft portion attachment portion 60.

The moving lever body portion 59 is formed in an approximately rectangular thin plate fashion and includes a first pressing portion 61 which is formed at a front end, which corresponds to a front end portion 56c side of the shaft portion 56. The first pressing portion 61 presses the operation lever 54 when the push button 51 is pressed toward the inside of the case portion 21 and is moved toward the pressing direction. The first pressing portion 61 is formed such that the moving lever body portion 59 is gradually thinned toward the front end, that is, formed to have a sloping surface 61a. On the sloping surface 61a, plural pieces of first convex portions 61b for reducing friction when the first pressing portion 61 abuts onto the operation lever 54 are formed. Two pieces of the first convex portion 61 are longitudinally formed along the sloping surface 61a to have a predetermined interval therebetween in a width direction which is orthogonal to a longitudinal direction going through the front end and the base end, for example.

The shaft portion attachment portion 60 is provided on the base end of the moving lever body portion 59 to be orthogonal to the moving lever body portion 59. The shaft portion attachment portion 60 is formed in an approximately rectangular thin plate fashion to be narrower than the moving lever body portion 59. Further, the shaft portion attachment portion 60 includes a through hole 60a through which the front end portion 56c of the shaft portion 56 is to be inserted. The shaft portion 56 is attached to the shaft portion attachment portion 60 by engaging retaining rings 62 and 62 respectively with a first annular groove 56d and a second annular groove 56e which are provided to the front end portion 56c so as to sandwich the shaft portion attachment portion 60 when the front end portion 56c protruding from the insertion hole 44c of the attachment hole 44 is inserted through the through hole 60a.

On base ends, which are positioned at the both sides of the shaft portion attachment portion 60, of the moving lever body portion 59, second pressing portions 63 and 63 are formed. The second pressing portions 63 and 63 press the operation lever 54 when the push button 51 is returned toward the outside of the case portion 21 by the return spring 52. Each of the second pressing portions 63 and 63 is formed such that the moving lever body portion 59 is gradually thinned toward the base end, that is, formed to have a sloping surface.

Further, on a main surface at both sides of the shaft portion attachment portion 60 at the base end side of the moving lever body portion 59, abutting portions 64 and 64 are provided. The abutting portions 64 and 64 abut onto the operation lever 54 when the push button 51 is returned toward the outside of the case portion 21 by the return spring 52. The abutting portions 64 and 64 respectively include second convex portions 64a and 64a which are formed to reduce friction when the abutting portions 64 and 64 abut on the operation lever 54.

The operation lever 54 includes an operation lever body portion 65, first and second protrusion portions 66 and 67 which protrude from the both sides, in a width direction, of a base end of the operation lever body portion 65 to the base end side, and a rotating shaft 68 which is provided to extend between the first and second protrusion portions 66 and 67. Such the operation lever 54 is freely rotatably supported with respect to the rear case 40 by disposing the rotating shaft 68 in a rotary groove 45 which is formed along the level difference 49 between the first rear surface portion 40f and the second rear surface portion 40g on an inner surface of the rear surface portion 40a of the rear case 40. The operation lever 54 is made of polyoxymethylene (POM) or the like, for example. Alternatively, the operation lever 54 may be made of other synthetic resin.

The operation lever body portion 65 is formed in an approximately rectangular thin plate fashion to be wider than the moving lever 53. The operation lever body portion 65 includes a plane surface body portion 65a and a sloping body portion 65b which is formed to be continuous with the plane surface body portion 65a and slopes with respect to the plane surface body portion 65a.

Figure 8:
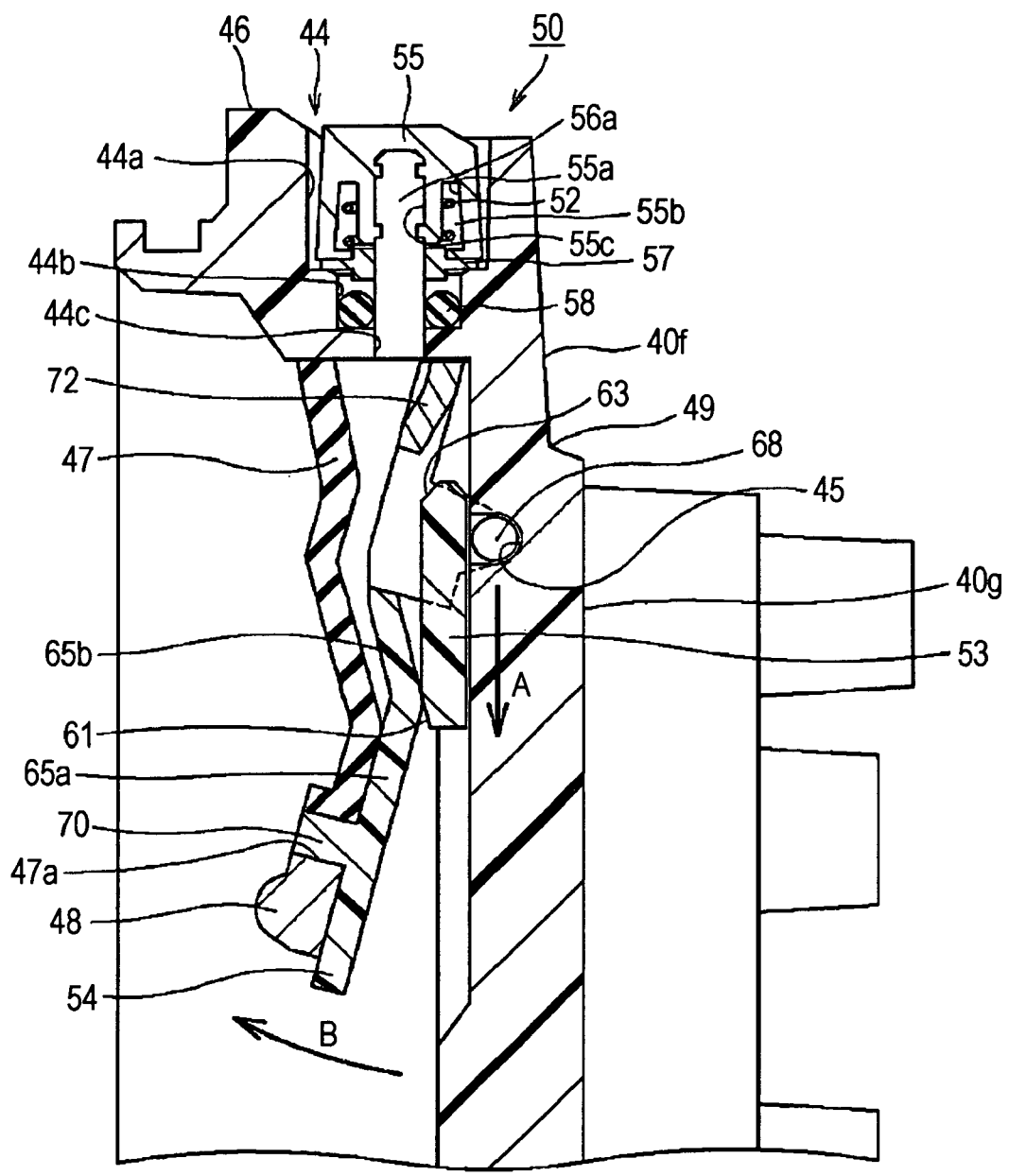
FIG. 8 is a longitudinal sectional view showing a state of the operation mechanism after rotation.
Figure 9:
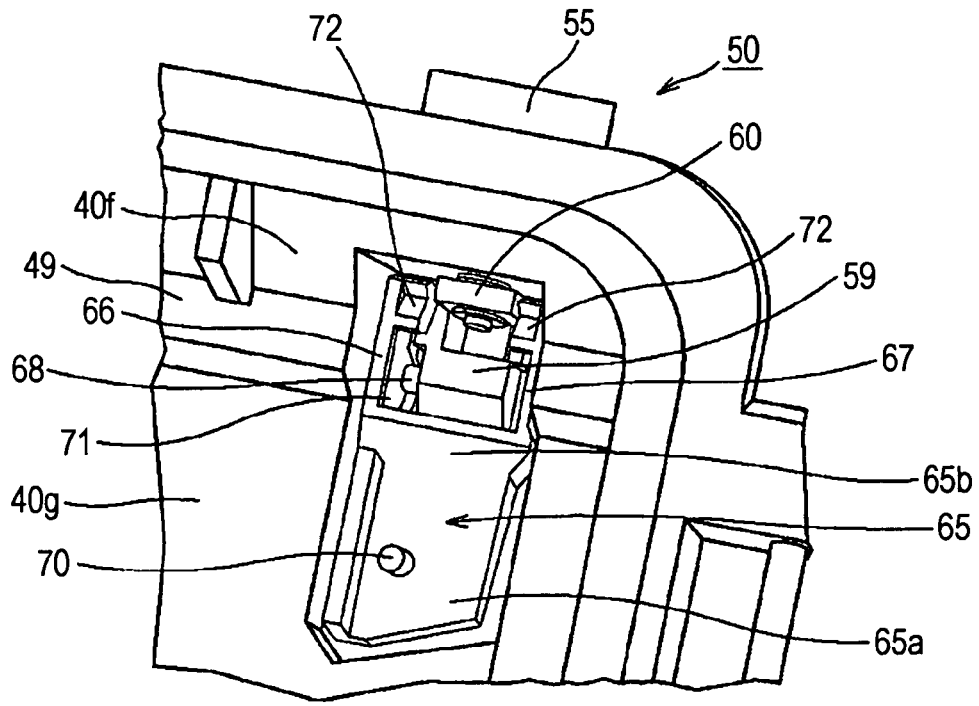
FIG. 9 is a perspective view showing a state of the operation mechanism before rotation.

When the moving lever 53 is moved to the pressing direction of the case portion 21 as shown in an arrow A direction in FIG. 8, the sloping body portion 65b is abutted on and pressed against the first pressing portion 61 of the moving lever 53 so as to rotate the operation lever 54 about the rotating shaft 68 in conjunction with the moving lever 53 in a direction orthogonal to the pressing direction with respect to the rear case 40, as shown by an arrow B direction in FIG. 8.

Further, the plane surface body portion 65a is provided with an engaging portion 70 that is engaged with the buffering member 47, which serves as a cushion of the digital still camera 1 which is housed and is provided so as to face the housing portion at the rear surface portion 40a of the rear case 40. The engaging portion 70 is formed in a convex fashion with respect to a main surface of the plane surface body portion 65a and is engaged with an engaging recessed portion 47a of the buffering member 47, thereby attaching the buffering member 47 to the operation lever 54.

The first and second protrusion portions 66 and 67 are formed on the base end of the sloping body portion 65b to be more largely separated in the width direction than the width of the moving lever 53 and to protrude from the sloping body portion 65b of the operation lever body portion 65 to the base end side. The rotating shaft 68 is provided to the first and second protrusion portions 66 and 67 so as to extend between the first and second protrusion portions 66 and 67. In the operation lever body portion 65, the moving lever 53 is housed in a space 71 which is formed by the sloping body portion 65b, the first and second protrusion portions 66 and 67, and the rotating shaft 68, and the moving lever 53 is moved in the pressing direction inside the space 71. The rotating shaft 68 is disposed in the rotary groove 45 which is formed along the level difference 49 between the first rear surface portion 40f and the second rear surface portion 40g on the inner surface of the rear surface portion 40a of the rear case 40, and enables free-rotatable support of the operation lever 54 with respect to the rear case 40. The rotating shaft 68 is freely rotatably supported along the level difference 49 which hardly bends even at high pressure, thereby being able to prevent the rear surface portion 40a of the rear case 40 from deforming and becoming inoperable even at high pressure.

On base ends of the first and second protrusion portions 66 and 67, protrusion pieces 72 which abut onto the moving lever 53 are provided. The protrusion piece 72 is formed to protrude toward the space 71, and includes a parallel protrusion portion 72a which is parallel with the plane surface body portion 65a of the operation lever body portion 65 and a sloping protrusion portion 72b which is formed to be continuous with the parallel protrusion portion 72a and slopes with respect to the parallel protrusion portion 72a. The parallel protrusion portion 72a abuts on the abutting portion 64 of the moving lever 53 so as to prevent rotation of the moving lever 53. When the moving lever 53 is moved toward the outside of the case portion 21, the sloping protrusion portion 72b is pressed by the second pressing portion 63 of the moving lever 53 and rotates the operation lever 54 about the rotating shaft 68 in conjunction with the moving lever 53 in a reverse direction of the arrow B direction shown in FIG. 8 so as to separate the contact portion 48 from the first icon 12a displayed on the touch panel display 10.

<4. Operation of Operation Mechanism>

Figure 10:
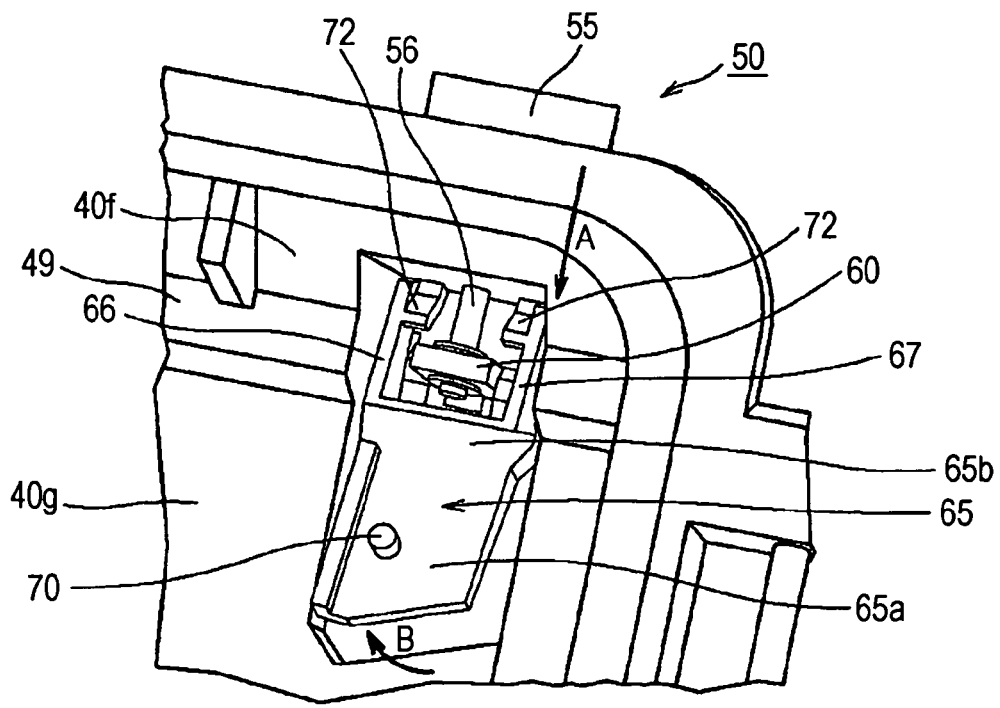
FIG. 10 is a perspective view showing a state of the operation mechanism after rotation.

When the push button 51 is pressed toward the inside of the case portion 21 against the energizing force of the return spring 52 by a user or the like, the moving lever 53 moves to the pressing direction as the arrow A direction shown in FIGS. 8 and 10 in synchronization with the push button 51. As the moving lever 53 moves to the pressing direction, the first pressing portion 61 of the moving lever 53 abuts onto the sloping body portion 65b of the operation lever 54 so as to press the sloping body portion 65b. Subsequently, when the operation lever 54 is pressed by the moving lever 53 in the pressing direction, the operation lever 54 rotates about the rotating shaft 68 in conjunction with the moving lever 53 to a direction orthogonal to the pressing direction with respect to the rear case 40, as the arrow B direction shown in FIGS. 8 and 10. Then, the operation lever 54 brings the contact portion 48 of the buffering member 47 into contact with the first icon 12a displayed on the touch panel display 10 which is housed in the housing portion of the waterproof case 20.

When the push button 51 is released from the pressing by a user or the like, the moving lever 53 moves toward the outside of the case portion 21 in synchronization with the push button 51 in a reverse direction of the arrow A direction shown in FIGS. 8 and 10 by the energizing force of the return spring 52. As the moving lever 53 moves to a reverse pressing direction, the second pressing portion 63 of the moving lever 53 abuts onto the sloping protrusion portion 72b of the operation lever 54 so as to press the sloping protrusion portion 72b. Subsequently, when the operation lever 54 is pressed by the moving lever 53 in the reverse pressing direction, the contact portion 48 rotates about the rotating shaft 68 in conjunction with the moving lever 53 in a reverse direction of the arrow B direction shown in FIGS. 8 and 10 so as to separate from the first icon 12a displayed on the touch panel display 10 which is housed in the housing portion of the waterproof case 20.

<5. Operational Effect of Waterproof Case>

According to the waterproof case to which the embodiment of the present invention is applied, when the push button 51 is pressed toward the inside of the case portion 21, then the moving lever 53 is moved to the pressing direction in synchronization with the push button 51 and the operation lever 54 is pressed by the moving lever 53, the operation lever 54 rotates about the rotating shaft 68 in conjunction with the moving lever 53 in a direction approximately orthogonal to the pressing direction. Accordingly, the contact portion 48 can be brought into contact with the first icon 12a which is displayed on the touch panel display 10 housed in the housing portion of the waterproof case 20, and thus the first icon 12a, which is displayed on the touch panel display 10 of the digital still camera 1 housed inside the case portion 21, can be operated from the outside of the case portion 21.

In addition, according to the waterproof case to which the embodiment of the present invention is applied, the pressing direction is orthogonal to the contact direction of the contact portion 48 as described above, so that the operation mechanism 50 can be disposed on the upper surface portion 40b of the rear case 40, that is, in the outside of the profile of the touch panel display 10. Accordingly, operability and visibility of the touch panel display 10 can be secured and the design flexibility can be improved.

Further, according to the waterproof case to which the embodiment of the present invention is applied, when the push button 51 is pressed and when the push button 51 is returned by the return spring 52, that is, returned to be in an initial state, the rotating shaft 68 is held between the moving lever 53 and the rotary groove 45 of the rear case 40 at all times so as to be prevented from dropping out.

Furthermore, according to the waterproof case to which the embodiment of the present invention is applied, the rotating shaft 68 is freely rotatably supported along the level difference 49 which hardly bends even at high pressure, being able to prevent the rear surface portion 40a of the rear case 40 from deforming and becoming inoperable even at high pressure.

<6. Modification of Waterproof Case>

In the waterproof case 20 according to the embodiment of the present invention, it is not limited to dispose the operation mechanism 50 on the upper surface portion 40b of the rear case 40, but the operation mechanism 50 may be disposed on the lower surface portion 40c, the left side surface portion 40d, or the right side surface portion 40e of the rear case 40.

The waterproof case 20 according to the embodiment of the present invention does not limitedly house the digital still camera, but the waterproof case 20 may house any device as long as the device has the touch panel display 10 and can be housed in the waterproof case. The waterproof case 20 may house other electronic device such as a video camera, a game instrument, a cell phone, and a PDA.

Further, in the waterproof case 20 according to the embodiment of the present invention, it is not limited to provide the contact portion 48 to the buffering member 47. In the waterproof case 20 according to the embodiment of the present invention, a contact portion may be provided to the operation lever 54, and the contact portion of the operation lever 54 may contact with the first icon 12a which is displayed on the touch panel display 10 housed in the housing portion of the waterproof case 20 when the operation lever 54 is rotated about the rotating shaft 68.

It should be understood by those skilled in the art that various modifications, combinations, sub-combinations and alterations may occur depending on design requirements and other factors insofar as they are within the scope of the appended claims or the equivalents thereof.

What is claimed is:

1. A waterproof case for an electronic device, comprising:
a case portion configured to house an electronic device that includes a touch panel display; and
an operation mechanism that is provided to the case portion and is configured to operate the touch panel display of the electronic device, the electronic device being housed in the case portion, from an outside of the case portion;
wherein the operation mechanism includes
a push button,
a return spring configured to energize the push button toward the outside of the case portion,
a moving lever configured to move in a pressing direction when the push button is pressed toward an inside of the case portion, and
an operation lever configured to rotate in a direction approximately orthogonal to the pressing direction so as to bring a contact portion into contact with a predetermined region of the touch panel display when being pressed by the moving lever.

2. The waterproof case for an electronic device according to claim 1, wherein when the push button is returned in a reverse direction of the pressing direction by the return spring, the moving lever presses the operation lever and rotates the operation lever so as to separate the contact portion from the predetermined region of the touch panel display.

3. The waterproof case for an electronic device according to any one of claims 1 and 2, wherein the operation lever includes a rotating shaft, and the rotating shaft is rotatably supported along a level difference of the case portion.

\* \* \* \* \*